(12) United States Patent
Tanaka

(10) Patent No.: US 7,239,571 B2
(45) Date of Patent: Jul. 3, 2007

(54) SEMICONDUCTOR MEMORY DEVICE

(75) Inventor: Tomoya Tanaka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 93 days.

(21) Appl. No.: 11/142,863

(22) Filed: May 31, 2005

(65) Prior Publication Data

US 2005/0265107 A1    Dec. 1, 2005

(30) Foreign Application Priority Data

May 31, 2004    (JP)    .............................. 2004-161668

(51) Int. Cl.
*G11C 8/00* (2006.01)
(52) U.S. Cl. ..................... 365/230.03; 365/63; 365/94; 365/190
(58) Field of Classification Search ........... 365/230.03, 365/94, 63, 190
See application file for complete search history.

(56) References Cited

U.S. PATENT DOCUMENTS 5,202,848 A * 4/1993 Nakagawara ................ 365/104
2005/0265107 A1* 12/2005 Tanaka ................... 365/230.03

FOREIGN PATENT DOCUMENTS

| JP | 3-179775 A | 8/1991 |
|----|-----------|--------|
| JP | 10-11991 A | 1/1998 |
| WO | WO-03/044868 A1 | 5/2003 |

\* cited by examiner

*Primary Examiner*—Anh Phung
*Assistant Examiner*—Pho M. Luu
(74) *Attorney, Agent, or Firm*—Morrison & Foerster LLP

(57) ABSTRACT

In a memory cell array in a hierarchical bit line mode in which sub-arrays in a virtual ground line mode are arranged in a column direction, data is read out at high speed, preventing fluctuation in wiring capacity of a main bit line. In each sub-array, one of a source electrode or a drain electrode in each of the memory cells in the same column is connected to a common first bit line, and the other thereof is connected to a second bit line. The first bit lines of one half of the sub-arrays positioned in the same column are connected to the first main bit line through selection transistors and the second bit lines thereof are connected to the second main bit line through selection transistors, and the first bit lines of the other half of the sub-arrays positioned in the same column are connected to the second main bit line through selection transistors and the second bit lines thereof are connected to the first main bit line through selection transistors.

8 Claims, 9 Drawing Sheets

(A)

(B)

(A)

(B)

SEMICONDUCTOR MEMORY DEVICE

CROSS REFERENCE TO RELATED APPLICATION

This Nonprovisional application claims priority under 35 U.S.C. §119(a) on Patent Application No. 2004-161668 filed in Japan on May 31, 2004, the entire contents of which are hereby incorporated by reference.

BACKGROUND OF THE INVENTION

1. Field of the Invention

The present invention relates to a semiconductor memory device and more particularly, it relates to a semiconductor memory device comprising a memory cell array in a virtual ground line mode which employs a memory cell array structure in a hierarchical bit line mode comprising a main bit line and a sub-bit line.

2. Description of the Related Art

Conventionally, there is a mode in which a memory cell is read out using a bit line and a virtual ground line in a non-volatile semiconductor memory device such as a mask ROM (mask programmable read only memory) and a flush memory (refer to Japanese Unexamined Patent Publication No. 10-11991, and Japanese Unexamined Patent Publication No. 3-179775, for example). Hereinafter, a description will be made using a memory cell of a mask ROM having a simple memory cell structure.

FIG. 5 is a conceptual view showing a reading mode using the virtual ground line. According to the mode, bit lines and virtual ground line are arranged alternately in a column direction, word lines are arranged in a row direction, a memory cell transistor comprising an MOSFET is arranged between the adjacent bit line and the virtual ground line, and a drain electrode and a source electrode of the memory cell transistor are connected to the bit line and the virtual ground line, respectively, in a memory cell array in which memory cells are arranged in the row direction and the column direction in the shape of a matrix. In addition, a gate electrode of the memory cell transistor is connected to the word line. The plurality of memory cell transistors are connected to one word line, so that area efficiency of the memory cell is raised. According to the memory cell transistor, a threshold value is set in a manufacturing stage so that it becomes either a transistor having a high threshold value (OFF transistor which has a threshold value higher than a high-level potential of the word line connected to the gate electrode and which is turned off regardless of a word line potential), or a transistor having a low threshold value (ON transistor which is turned on when the word line potential becomes higher than the threshold value) (binary data is written in each memory cell). At the time of reading out, the word line and the bit line and the virtual ground line connected to the transistor to be read out are selected, the selected bit line is charged to a predetermined potential, the selected virtual ground line is connected to the ground potential, and the selected word line is brought to a high level. A difference in current of the ON transistor and the OFF transistor in this state is detected by the sense circuit and the binary data stored in the memory cell is determined.

In general, as a mode in which the data stored in the memory cell array is read out at high speed in a high-capacity semiconductor memory device, the hierarchical bit line mode is well-known (refer to Japanese Unexamined Patent Publication No. 3-179775, for example). According to the memory cell array in the hierarchical bit line mode, the memory cell array is divided into a plurality of blocks in the column direction, a bit line in each block is set as a sub-bit line (called a local bit line also), and the plurality of sub-bit lines in the blocks are collectively connected to a main bit line (called a global bit line also) through block selection transistors. When the memory cell is selected, the main bit line is selected and then the sub-bit line connected to the selected main bit line is selected by the block selection transistor. Hereinafter, a reading operation in the hierarchical bit line mode will be described with reference the drawings. FIG. 6 shows a constitution example of a memory cell array using the hierarchical bit line mode. In addition, according to the memory cell array illustrated in FIG. 6, a virtual ground line has the same hierarchical structure as that of the bit line.

A memory cell group sandwiched by control signals BLKs 1 and 2 and BLKs 3 and 4 of block selection transistors and having word lines WL0 to WLn connected to gate electrodes is called the block. In order to raise area efficiency of the memory cell, a plurality (two in FIG. 6) of sub-bit lines SBi (i=even number) are connected to a main bit line MBi (i=even number) through a block selection transistor BK-1 or the like in the block. When the memory cell is accessed through the main bit line in the block, a junction capacity induced by a diffusion layer of a source or a drain of the memory cell transistor connected to the main bit line can be considerably reduced, so that readout can be performed at high speed.

As shown in FIG. 6, the block selection transistor BK1-1 or the like is selected by a bank selection line BLK1-1 or the like. The main bit line MB2 or the like is connected to a sub-bit line SB 4 or the like through the block selection transistor BK1-1. The main bit line MBi (i=even number) of the memory arrays is connected to a charging circuit 22, a sense circuit 23 and the like through a block selection circuit 20 which selects the block to be read out and a charging and grounding selection circuit 21. A main virtual ground line MBi (i=odd number) is connected to the charging circuit 22 or the ground line or the like through the block selection circuit 20 and the charging and grounding selection circuit 21. The charging and grounding selection circuit 21, the charging circuit 22, the sense circuit 23 are connected to the plurality of block selection circuits 20 in some cases.

A readout operation of the memory cell array circuit shown in FIG. 6 will be described. Here, it is assumed that a memory cell transistor M4 is selected and read out. The word line WL0 connected to a gate of the transistor M4 is brought to a high level and the other word lines (WLn) are brought to a low level. In order to turn on the block selection transistor BK1-1, a control signal BLK1 of the block selection transistor is brought to the high level and in order to turn on a block selection transistor BK3-2, a control signal BLK3 is brought to the high level and other control signals BLK2 and BLK4 are brought to the low level. Thus, a current path (MB2)-(BK1-1)-(SB4) from the main bit line to the memory cell and a current path (SB5)-(BK3-2)-(MB3) from the memory cell to the main virtual ground line are formed in the transistor M4. In the case the transistor M4 is the ON transistor, when the BSEL2 is brought to the high level, VGSEL1 is brought to the high level, BLOCKSEL1 is brought to the high level, BSEL1 is brought to the low level, and VGSEL2 is brought to the low level, the selected main bit line MB2 becomes a charged potential and the selected main virtual ground line MB3 becomes the ground potential, so that a current flows through a path (MB2)-(BK1-1)-(SB4)-(M4)-(SB5)-(BK3-2)-(MB3). The memory cell transistor M4 is determined to be the ON transistor when the sense circuit 23 connected to the selected main bit line MB2 through the transistor TR1 of the block selection circuit 20 and the transistor TR2 of the charging and grounding selection circuit 21 detects a change and the like in charged potential of the selected main bit line MB2.

However, in a case where the memory cell transistor M4 is the OFF transistor and the transistors M3, M2, M1, M0 and the like of the non-selected memory cells in the same row as the transistor M4 are ON transistors, since the word line WL0 which is a gate line of each transistor is common, even when the transistor M4 is the OFF transistor, a current path passing through the transistors M3, M2 and M1 is formed. That is, when the selected main bit line MB2 becomes the charged potential, a transitional current which charges parasitic capacity of the bit line or the virtual ground line connected to each memory cell flows through (MB2)-(BK1-1)-(SB4)-(M3)-(M2)-(M1) . . . . The current flowing in this current path is tentatively called a detour outflow current. As a result, although the transistor M4 to be read out is the OFF transistor, the current path from the selected main bit line to each bit line and the virtual ground line is formed as if it is the ON transistor, so that error readout is generated or a margin of the readout operation is lowered. In order to prevent such error readout operation, a method in which a non-selected bit line and a non-selected virtual ground line are charged to a predetermined charged potential is conventionally employed.

According to the illustrated circuit in FIG. 6, a non-selected main bit line MB0 and a non-selected main virtual ground line MB1 are brought to the charged potential. The sub-bit line SB0 and the sub-virtual ground line SB 1 become the charged potential through the block selection transistor. Thus, even when the memory cell transistors M3, M2, M1, M0 and the like are the ON transistors, the detour outflow current is not generated when the memory cell transistor M4 is read out, so that a difference in potential change of the selected main bit line MB2 appears when the transistor M4 is the ON transistor and when it is the OFF transistor. As a result, the memory cell can be stably read out.

However, according to the mode in which the non-selected bit line and the non-selected virtual ground line are charged to prevent the detour outflow current, the readout operation margin is lowered when the memory cell transistor to be read out is the ON transistor.

Consequently, as shown in FIG. 7, the applicant of this application separately applies for a patent regarding a semiconductor memory device in which an influence of the detour outflow current is considerably reduced and a readout operation margin is prevented from being lowered by dividing a memory cell array into sub-arrays in columns every four memory cells, so that large capacity can be implemented and an operation can be performed at high speed (U.S. patent Ser. No. 10/769,381). According to a constitution shown in FIG. 7, one sub-array comprises five sub-bit lines LB1 to LB5 in which two of them function as bit lines or virtual ground line and three of them function as bit lines or the virtual ground line. In addition, one sub-array comprises two main bit lines GBA and GBB, odd-numbered sub-bit lines LB1, LB3 and LB5 are connected to the main bit line GBA through bit line selection transistor BK1, BK3 and BK5, respectively, and even-numbered sub-bit lines LB2 and LB4 are connected to the main bit line GBB through bit line selection transistor BK2 and BK4, respectively, and when one of the bit line selection transistors BK1,BK3 and BK5,and one of the bit line selection transistors BK2 and BK4 are turned on, one odd-numbered sub-bit line and one even-numbered sub-bit line are connected to the main bit lines GBA and GBB, respectively, so that memory cells in one column are selected in the sub-array.

According to the above hierarchical bit line mode, since the memory cell array is divided into the plurality of blocks in the column direction, the plurality of sub-arrays (blocks) shown in FIG. 7 are arranged in (even-number normally) columns direction, so that the memory cell array is hierarchically constituted. FIG. 8 simply shows a case where two sub-arrays are arranged in the column direction. In this case, when it is assumed that the number of sub-arrays in the column direction is 2n, the total number of the bit line selection transistor BK1, BK3 and BK5 connected to the main bit line GBA is 6n and the total number of the bit line selection transistor BK2 and BK4 connected to the main bit line GBB is 4n.

Therefore, when the number of the columns of the memory cells in the sub-array is four, a total junction capacity of the bit line selection transistors connected to the main bit line GBA is 1.5 times as much as a total junction capacity of the bit line selection transistors connected to the main bit line GBB, so that there is provided a difference in junction capacity between the main bit lines GBA and GBB as a difference in each wiring capacity. Here, when it is assumed that the number of columns of the memory cells in the sub-array is 2k in general, the number of the bit line selection transistors to select the odd-numbered sub-bit lines is k+1 and the number of the bit line selection transistors to select the even-numbered sub-bit lines is k, so that a ratio of the junction capacity of the main bit line GBA to that of the main bit line GBB is (k+1)/k in the wiring capacities. Thus, when the number of the columns of the memory cells in the sub-array is small, imbalance of the wiring capacities of the main bit lines GBA and GBB becomes noticeable.

Meanwhile, when the memory cell in the sub-array is perfectly symmetric between the source and the drain, since one of the odd-numbered or the even-numbered sub-bit line is allocated to the bit line to read out the data and the other is allotted to the virtual ground line fixedly, one of the main bit lines GBA and GBB becomes the main bit line to read out the data constantly and the other becomes the main bit line as the virtual ground line, so that the unbalance of the wiring capacities does not affect the reading operation. That is, when there is no problem characteristically if either diffusion region of each memory cell becomes the source or the drain electrode, the source electrodes are connected to each other and the drain electrodes are connected to each other in the adjacent memory cells in the row direction, and each drain electrode is connected to the bit line (even-numbered sub-bit line, for example) and each source electrode is connected to the virtual ground line (odd-numbered sub-bit line, for example).

However, when the memory cell transistor has an asymmetric structure in the source and the drain, since it is generally considered that fluctuation in cell characteristics between the memory cells can be prevented by making the asymmetric directionality face the same direction in the memory cell array, one source electrode is connected to the other drain electrode in the adjacent two memory cells in the row direction, and the bit line connected to the memory cell in a certain column becomes the virtual ground line of the adjacent other memory cell in the row direction. Therefore, both main bit lines GBA and GBB can be the main bit line to read out the data depending on the column position of the selected memory cell.

In addition, even when the memory cell transistor is symmetric between the source and the drain, in a case of a memory cell which can store 2-bit data for example, and a multi-level memory cell which can distinctively read each bit depending on the current flow direction, since both sub-bit line connected to the source side of the memory cell transistor and sub-bit line connected to the drain thereof can be the bit line to read out the data, both two main bit lines GBA and GBB can be the main bit lines to read out the data depending on the data stored in the memory cell similar to the above.

As an example of the multi-level memory cell, there is a memory cell comprising a sidewall memory element shown in FIG. 3. The sidewall memory element is described in detail in the international publication pamphlet of the PCT international application by the applicant of this application (International Publication WO03/044868). As shown in FIG. 3(A), a sidewall memory element 100 comprises a gate electrode 104 formed on a semiconductor layer 102 through a gate insulation film 103, a channel region 101 arranged under the gate electrode 104, diffusion regions 105 and 106 arranged on both sides of the channel region 101 and having a conductivity type opposite to that of the channel region 101, and memory functioning bodies 107 and 108 formed on both sidewalls of the gate electrode 104 and having a function to maintain electric charges. FIG. 3(B) shows symbols of the sidewall memory element. Referring to FIG. 3(B), nodes G, S, D are the gate electrode 104, the source electrode 105, the drain electrode 106, respectively, and m1 and m2 are the memory functioning bodies.

In order to write data in the memory functioning body m1, a high voltage is applied to the node G, so that the node S becomes at high voltage and the node D is at the GND level and a current flows from the node S to the node D. Thus, hot electrons are generated and inputted to the memory functioning body m1 to write the data. When data is to be written in the memory functioning body m2, the voltage conditions of the node S and the node D are reversed, so that a current flows from the node D to the node S.

Next, a reading operation of the information written in the memory functioning body will be described. When the information written in the memory functioning body m1 is read out, 3V is applied to the node G, for example, 1.2V is applied to the node D and the node S is brought to the GND level. At this time, when electrons are not stored in the memory functioning body m1, the drain current is easily flow. Meanwhile, when the electrons are stored in the memory functioning body m1, an inversion layer is not easily formed in the vicinity of the memory functioning body m1 and the drain current does not easily flow. Thus, the information stored in the memory functioning body m1 can be read out by detecting levels of the drain current. At this time, since the vicinity of the node D is pinched off, a fact whether the electric charges are stored in the memory functioning body m2 or not does not affect the drain current. In addition, when the information of the memory functioning body m2 is read out, the voltage conditions of the node S and the node D are reversed. Thus, one memory element stores two-bit information, which can be read out.

As described above, in the case of the memory cell array in the hierarchical bit line mode comprising multi-level memory cells which can be read out by discriminating stored bits by the memory cell having the asymmetric structure or the direction of the readout current, when a circuit mode in which data is read out by charging and discharging the main bit line on the data readout side is employed for high-speed reading, the difference (unbalance) in junction capacity in the wiring capacities between the main bit lines GBA and GBB considerably affects the fluctuation in charging and discharging time of the main bit line. That is, a period of data readout is controlled by the memory cell on the side of the main bit line having a large wiring capacity, that it, a long charging and discharging time, which is a cause of a delay in access time for the data readout.

A description will be made of a readout operation when a memory cell comprises the above sidewall memory element and the like and there is provided a memory cell array structure in a conventional hierarchical bit line mode with reference to FIG. 9. Referring to FIG. 9, it is assumed that a current in the transistor A flows from the right to the left. A sub-bit line connected to the right side of the transistor A is set as the bit line B to read out the data, and a sub-bit line connected to the left side thereof is set as the virtual ground line C. The sub-bit line B is connected to a main bit line E through a selection transistor D, and a virtual ground line C is connected to a main bit line G through a selection transistor F.

At the time of readout, the main bit line E is charged to a predetermined voltage, the transistor D connected thereto is turned on to charge the sub-bit line B, the selected main bit line G is brought to the ground potential, the transistor F connected thereto is turned on and the virtual ground line C is brought to the ground potential. Then, a selected word line H is brought to the high level. In this state, a difference in current amount of the transistor A to be read out is detected by a sense circuit to determine the data of the memory cell. While the main bit line E is charged in the reading mode, according to the conventional hierarchical bit line mode, when it is assumed that the number of the sub-arrays (blocks) is 2n, the number of the selection transistors D connected to the main bit line E to read out the data is 4n and the number of the selection transistor F connected to the main bit line G to be grounded is 6n.

Next, a case the readout is performed when the current in the transistor A flows from the left side to the right side is considered. At this time, the main bit line G is charged, which is totally contrary to the above case where the current in the transistor A flows from the right side to the left side. In this case, the number of the selection transistors connected to the main bit line G to read out the data becomes 6n which is 1.5 times as many as the above 4n. This is because the total of the junction capacity is different, which means that the charging and discharging time of the main bit line in the readout operation depends on the direction of the readout current. In addition, a difference between the bit line current of the selected memory cell and a bit line current of a reference cell is detected by the sense circuit, and a time until the difference appears significantly depends on the direction of the readout current. That is, since the totals of the junction capacities of the selection transistors contained in the wiring capacities between two main bit lines are different, the readout time becomes different.

SUMMARY OF THE INVENTION

The present invention was made in view of the above problems and it is an object of the present invention to provide a semiconductor memory device in which fluctuation in wiring capacity of a main bit line is prevented and high-speed readout is implemented in a memory cell array in a virtual ground line mode which employs a memory cell array structure in a hierarchical bit line mode.

According to a semiconductor memory device of the present invention to attain the above object comprises sub-array in which memory cells each having one first electrode and a pair of second electrodes and being able to read stored contents by a conductive state between the second electrodes depending on a potential of the first electrode are arranged with even numbers in a row direction and with the plural number in a column direction in the shape of arrays, and comprises a memory cell array in which the sub-arrays are arranged at least in the column direction, in which the sub-array is provided such that the first electrodes of the memory cells in the same row are connected to a common word line, the second electrodes on one side are connected between the adjacent two memory cells in the row direction, the second electrodes on one side of the memory cells in the same column are connected to a common first bit line, the second electrodes on the other side of the memory cells in the same column are connected to a common second bit line, and the first bit lines and the second bit lines are alternately provided, each of the sub-arrays in the same column comprises a common first main bit line and a common second main bit line, the first bit lines of one half of the sub-arrays positioned in the same column are connected to the first main bit line through selection transistors and the second bit lines thereof are connected to the second main bit line through selection transistors, the first bit lines of the other half of the sub-arrays positioned in the same column are connected to the second main bit line through selection transistors and the second bit lines thereof are connected to the first main bit line through selection transistors.

According to the semiconductor memory device of the present invention, since the number of the selection transistors connected to the first main bit line is the same as that connected to the second main bit line which are common in each sub-array positioned in the same column, the total junction capacities of the selection transistors contained in the wiring capacities of the main bit lines are the same. As a result, the wiring capacity of each main bit line counterbalances with each other. That is, even when either the first main bit line or the second main bit line becomes the main bit line to read out the data, depending on the column position of the selected memory cell or the selected bit of the multi-level memory cell, the charging and discharging times of the main bit lines become the same, so that a delay in readout access time caused by the fluctuation in charging and discharging time between the main bit lines can be avoided.

Here, even if the number of the sub-arrays positioned in the same column is the odd number (2k+1, for example), when its half is set at k (or k+1) and the other half is set at k+1 (or k), the difference of the wiring capacity between the main bit lines can be reduced to be a junction capacity of one selection transistor, so that the same effect as in the case the number of the sub-arrays positioned in the same column is the even number can be provided.

The semiconductor memory device according to the present invention is characterized in that the memory cell array comprises sub-arrays arranged in the row direction and the column direction in the shape of an array. According to the characteristics, since the memory cell array is divided into the plurality of sub-arrays in the row direction also, the total number of the same memory cells, that is, the number of columns of the memory cells in each sub-array can be reduced with respect to a storage capacity. As a result, a detour outflow current through the adjacent non-selected memory cell can be reduced and a readout operation margin can be prevented from being lowered, so that the capacity of the semiconductor memory device can be enlarged and high-speed operation can be implemented.

Therefore, even in the case where the memory cell array is divided into the plurality of sub-arrays in the row direction and the number of the columns in each sub-array is reduced to decrease the detour outflow current, to prevent the readout operation margin from being lowered in the memory cell array structure in the conventional hierarchical bit line mode, according to the present invention, while the balance of the wiring capacity between the main bit lines is maintained, the high-speed readout can be implemented, so that the capacity of the semiconductor memory device can be enlarged and high-speed operation can be implemented as described above.

DETAILED DESCRIPTION OF THE INVENTION

One embodiment of a semiconductor memory device according to the present invention (referred to as the "device of the present invention" occasionally hereinafter) will be described with reference to the drawings.

EMBODIMENT 1

Figure 1:
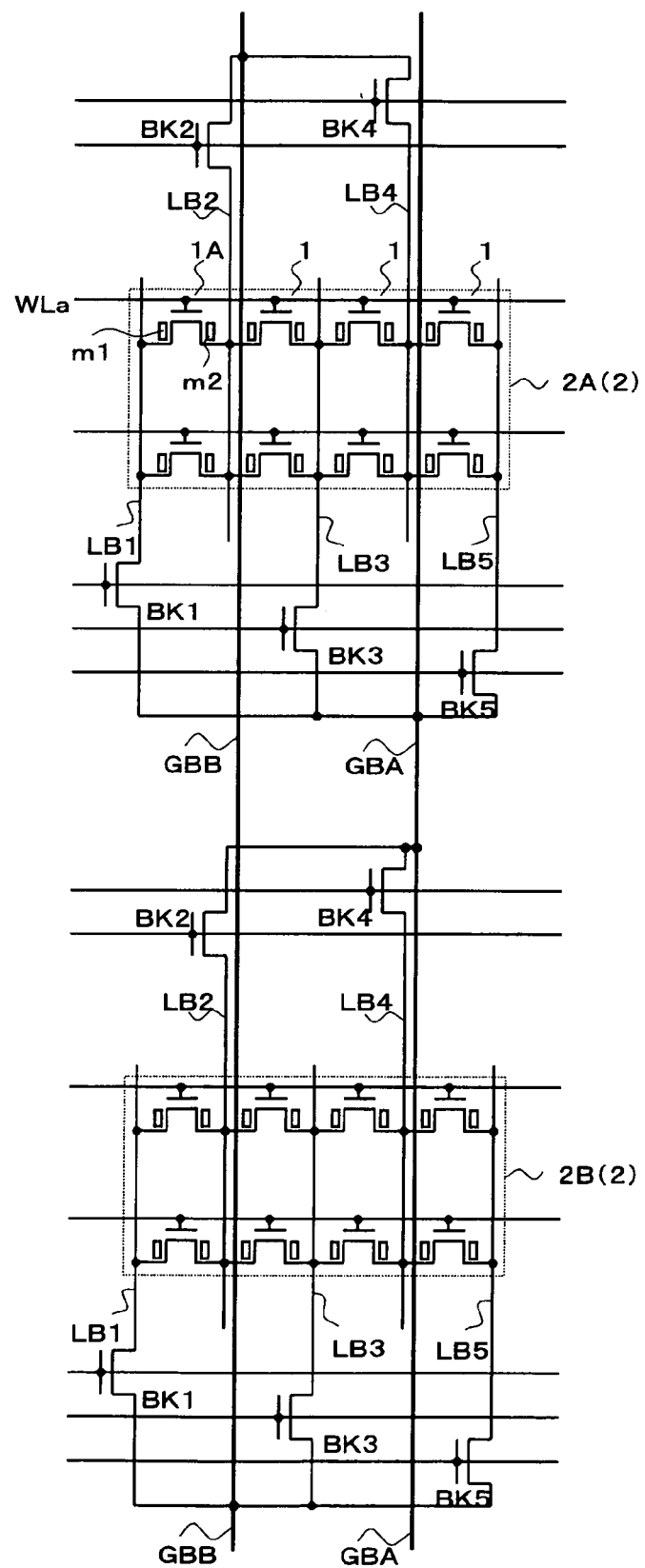
FIG. 1 is a circuit diagram simply showing a memory array constitution according to an embodiment 1 of a semiconductor memory device in the present invention.

FIG. 1 is a circuit diagram simply showing a memory cell array structure of the device of the present invention. According to the memory cell array in the device of the present invention, a sub-array 2 is provided such that memory cells 1 are arranged with even numbers in rows and with plural numbers in columns in the shape of an array, and the sub-arrays 2 are arranged with plural numbers in rows and columns. FIG. 1 shows two sub-arrays 2A and 2B which are adjacent to each other in the column direction. Although the number of columns (the number of arrangements in the row direction) of the memory cells of each sub-array 2 shown in FIG. 1 is four, it may be another even number such as eight or sixteen other than four.

Figure 3:
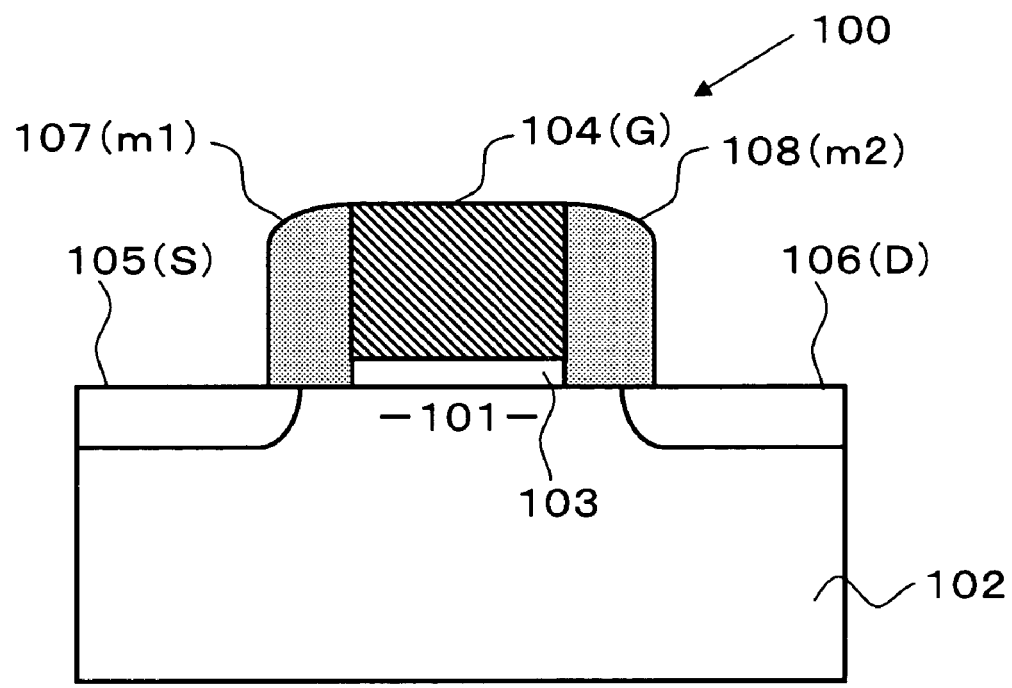
FIG. 3(A) is a sectional view showing a structure of a sidewall memory element as an example of a multi-level memory cell used in a memory cell of the memory array according to the embodiment 1 of the semiconductor memory device in the present invention and FIG. 3(B) is a symbol diagram for a circuit notation.
Figure 3:
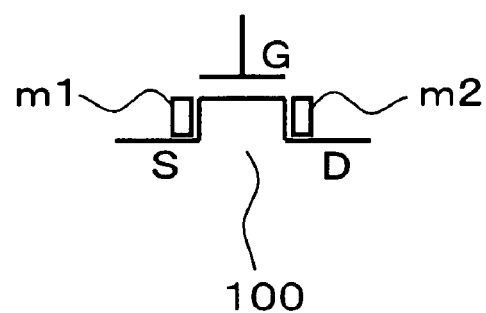

The memory cell 1 is a non-volatile memory cell comprising a gate electrode (a first electrode), a source electrode (one of second electrodes) and a drain electrode (the other of the second electrodes), and having a MOSFET structure in which memory contents can be read out according to a conductive state between the source and the drain electrodes, depending on a potential of the gate electrode. According to this embodiment, it comprises a sidewall memory element 100 shown in FIG. 3(A) which comprises a gate electrode 104 formed on a semiconductor layer 102 through a gate insulation film 103, a channel region 101 arranged under the gate electrode 104, diffusion regions 105 and 106 arranged on both sides of the channel region 101 and having a conductivity type opposite to that of the channel region 101, and memory functioning bodies 107 and 108 formed on both sidewalls of the gate electrode 104 and having a function to maintain electric charges. Here, the memory cell 1 can read data stored in each of the two memory functioning bodies m1 and m2 shown in FIG. 3(B), depending on plus or minus of a current direction between the source electrode S and the drain electrode D.

In each of the sub-array 2, the gate electrodes of the memory cells 1 in the same row are connected to a common word line, the source electrodes or the drain electrodes are connected to each other between the two adjacent memory cells in the row direction, and the source electrodes or the drain electrodes of the memory cells in the same column are connected to a common sub-bit line LBi (i=1 to 5). The sub-bit lines LBi comprise odd-numbered first bit lines LBi (i=1, 3 and 5) and even-numbered second bit lines LBi (i=2 and 4). In addition, each sub-array 2 in the same column comprises a common main bit line GBA and a common second main bit line GBB.

Referring to FIG. 1, in the plurality of the sub-arrays 2 positioned in the same column and connected to the common first main bit line GBA and the common second main bit line GBB, the odd-numbered sub-array is a sub-array 2A and the even-numbered sub-array is a sub-array 2B. Thus, according to this embodiment, in the sub-array 2A, the three first bit lines LBi (i=1, 3 and 5) are connected to the first main bit line GBA through selection transistors BK1, BK3 and BK5, respectively, and the two second bit lines LBi (i=2 and 4) are connected to the second main bit line GBB through selection transistors BK2 and BK4, respectively, and in the other sub-array 2B, the three first bit lines LBi (i=1, 3 and 5) are connected to the second main bit line GBB through selection transistors BK1, BK3 and BK5, respectively, and the two second bit lines LBi (i=2 and 4) are connected to the first main bit line GBA through selection transistors BK2 and BK4, respectively, As shown in FIG. 1, the first main bit line GBA is connected to the three selection transistors BK1, BK3 and BK5, in the odd-numbered sub-array 2A, and it is connected to the two selection transistors BK2 and BK4 in the even-numbered sub-array 2B. In addition, the second main bit line GBB is connected to the two selection transistors BK2 and BK4 in the odd-numbered sub-array 2A, and it is connected to the three selection transistors BK1, BK3 and BK5 in the even-numbered sub-array 2B. Therefore, each of the first main bit line GBA and the second main bit line GBB is connected to all of the five selection transistors BKi (i=1 to 5) in a couple of the odd-numbered sub-array 2A and the even-numbered sub-array 2B and a junction capacity in each main bit line is equal to the other. Therefore, totals of the junction capacities of the selection transistors BKi (i=1 to 5) contained in wiring capacities of the first main bit line GBA and the second main bit line GBB commonly connected to sub-arrays positioned in the same column are the same, and each wiring capacity becomes equal. As a result, a time delay caused by a difference in wiring capacity between the two main bit lines is not generated between a charging and discharging time of the first main bit line GBA at the time of a readout operation by connecting the first main bit line GBA to a sense amplifier as a data readout main bit line and connecting the second main bit line GBB to the ground potential, and a charging and discharging time of the second main bit line GBB at the time of readout operation by connecting the second main bit line GBB to the sense amplifier as the data readout main bit line and connecting the first main bit line GBA to the ground potential. Thus, a readout access time can be prevented from being fluctuated.

A description will be made of a voltage condition applied to each part when information stored in the memory functioning body m1 of the memory cell 1A in the sub-array 2A is read out. First, in order to select the memory cell 1A, the selection transistors BK1 and BK2 in the sub-array 2A are turned on and the other selection transistors BK3 to BK5 in the sub-array 2A and all of the selection transistors in the other sub-array are turned off. Then, 3V is applied to a word line WLa connected to the gate electrode of the memory cell 1A, for example, and the first main bit line GBA is connected to the ground potential, and the second main bit line GBB is connected to the sense amplifier (not shown) and charged to 1.2V. Since 0V is applied to the first main bit line GBA and 1.2V is applied to the second main bit line GBB, 1.2V is applied to the source electrode or the drain electrode which is the opposite side of the memory functioning body m1 of the memory cell 1A through the second bit line LB2, and 0V is applied to the source electrode or the drain electrode on the side of the memory functioning body m1 through the first bit line LB1. Thus, information stored in the memory functioning body m1 in the two memory functioning bodies m1 and m2, that is, a current corresponding to an amount of electrons stored in the memory functioning body m1 flows from the second main bit line GBB to the first main bit line GBA as a cell current of the memory functioning body m1 of the memory cell 1A. By comparing the current with a reference current of a reference cell (not shown) by the sense amplifier (not shown), the data of the memory functioning body m1 is read out. In addition, when information written in the memory functioning body m2 of the memory cell 1A is read out, conditions of the two main bit lines GBA and GBB are reversed and the second main bit line GBB is connected to the ground potential and the first main bit line GBA is connected to the sense amplifier and charged to 1.2V Here, since the wiring capacity of the first main bit line GBA is equal to that of the second main bit line GBB, when the data in the memory functioning body m1 and the data in the memory functioning body m2 are read out, if an electron amount stored in the memory functioning body m1 is the same as that of the memory functioning body m2, their access times for data readout become the same.

EMBODIMENT 2

Figure 2:
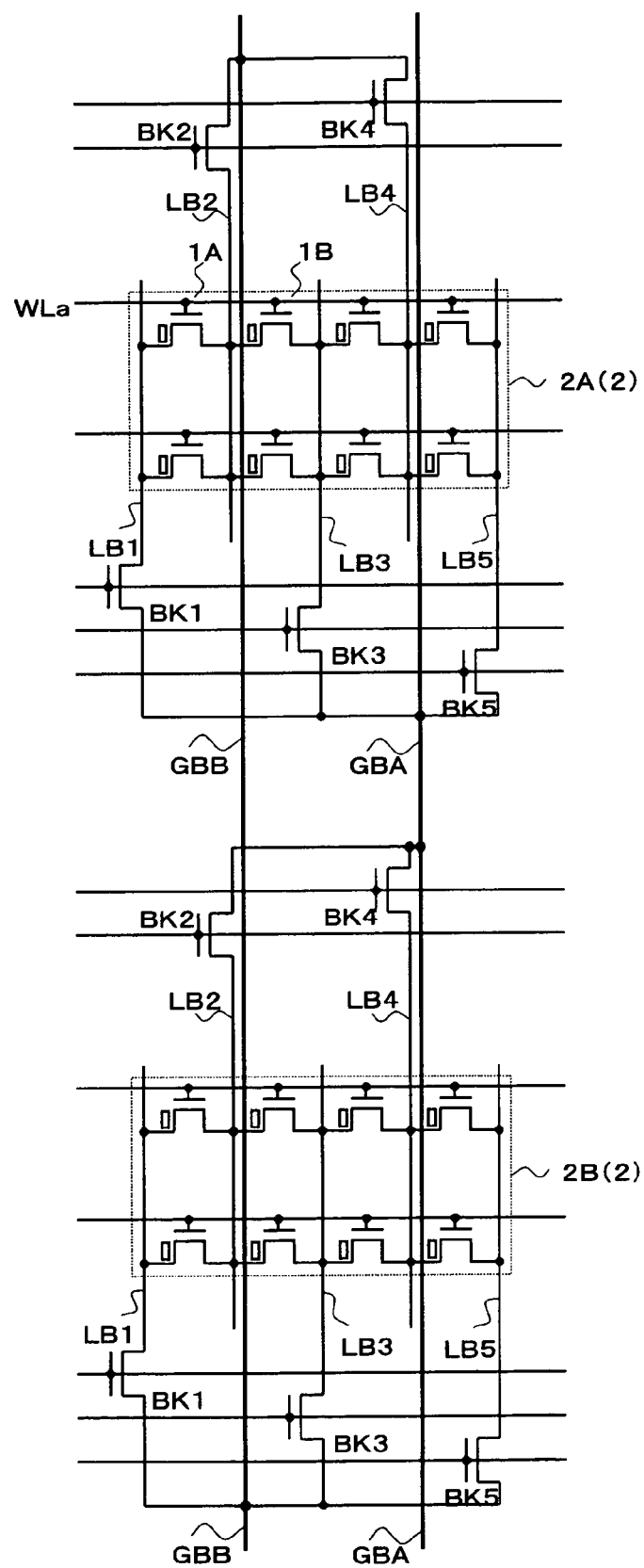
FIG. 2 is a circuit diagram simply showing a memory array constitution according to an embodiment 2 of a semiconductor memory device in the present invention.

FIG. 2 is a circuit diagram simply showing a memory cell array structure of a device of the present invention according to an embodiment 2. According to the memory cell array in the device of the present invention, a sub-array 2 is provided such that memory cells 1 are arranged with even numbers in rows and with plural numbers in columns in the shape of an array, and the sub-arrays 2 are arranged with plural numbers in rows and columns. FIG. 2 shows two sub-arrays 2A and 2B which are adjacent to each other in the column direction. Although the number of columns (the number of arrangements in the row direction) of the memory cells of each sub-array 2 shown in FIG. 2 is four, it may be another even number such as eight or sixteen other than four.

Figure 4:
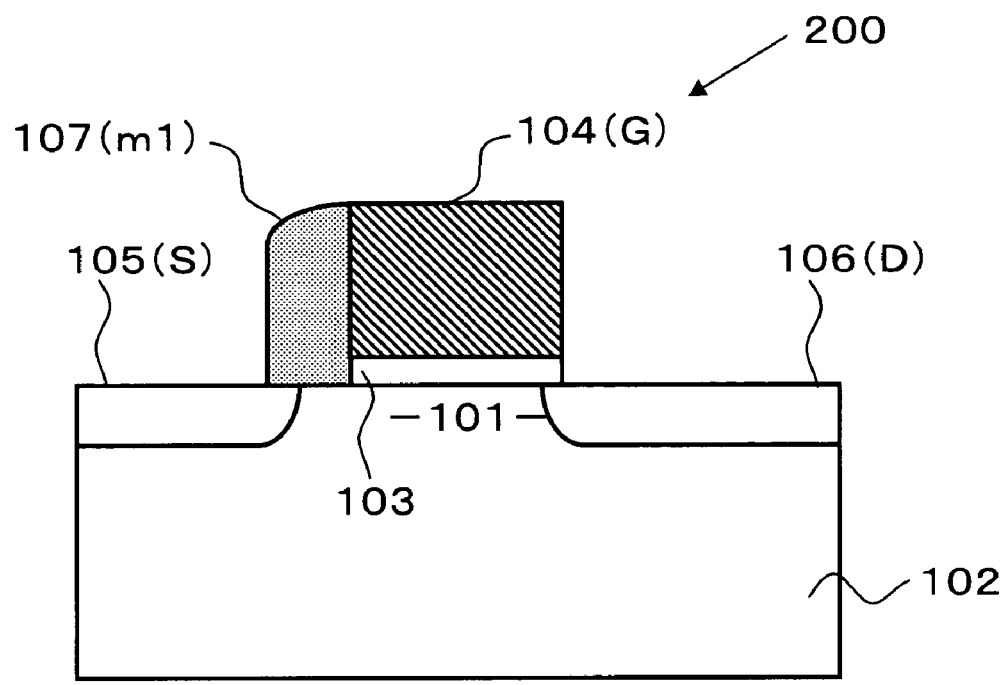
FIG. 4(A) is a sectional view showing a structure of a sidewall memory element as an example of an asymmetric memory cell used in a memory cell of the memory array according to the embodiment 2 of the semiconductor memory device in the present invention and FIG. 4(B) is a symbol diagram for a circuit notation.
Figure 4:
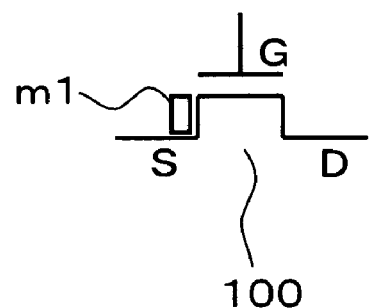
Figure 5:
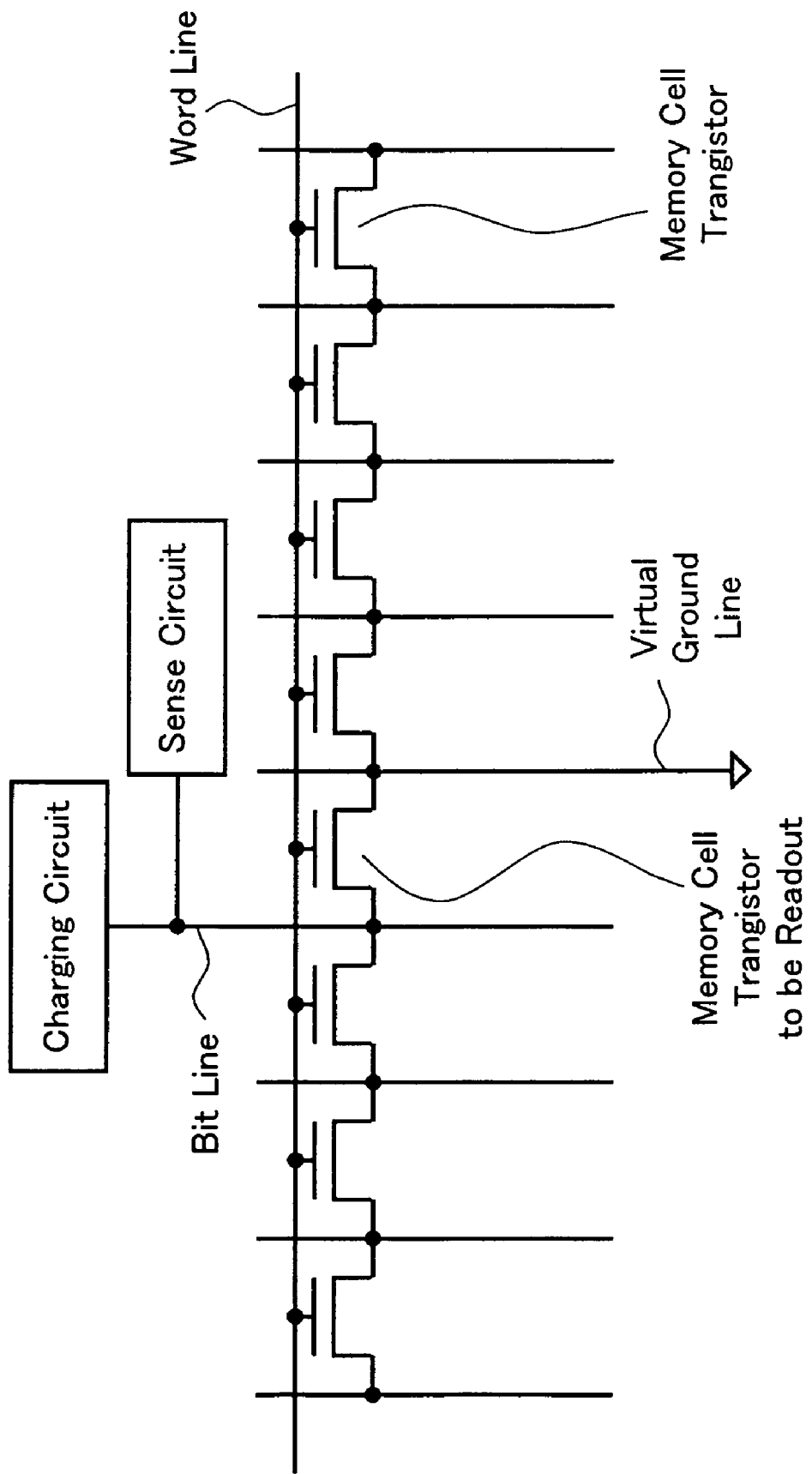
FIG. 5 is a conceptual view of a reading mode using a virtual ground line.
Figure 6:
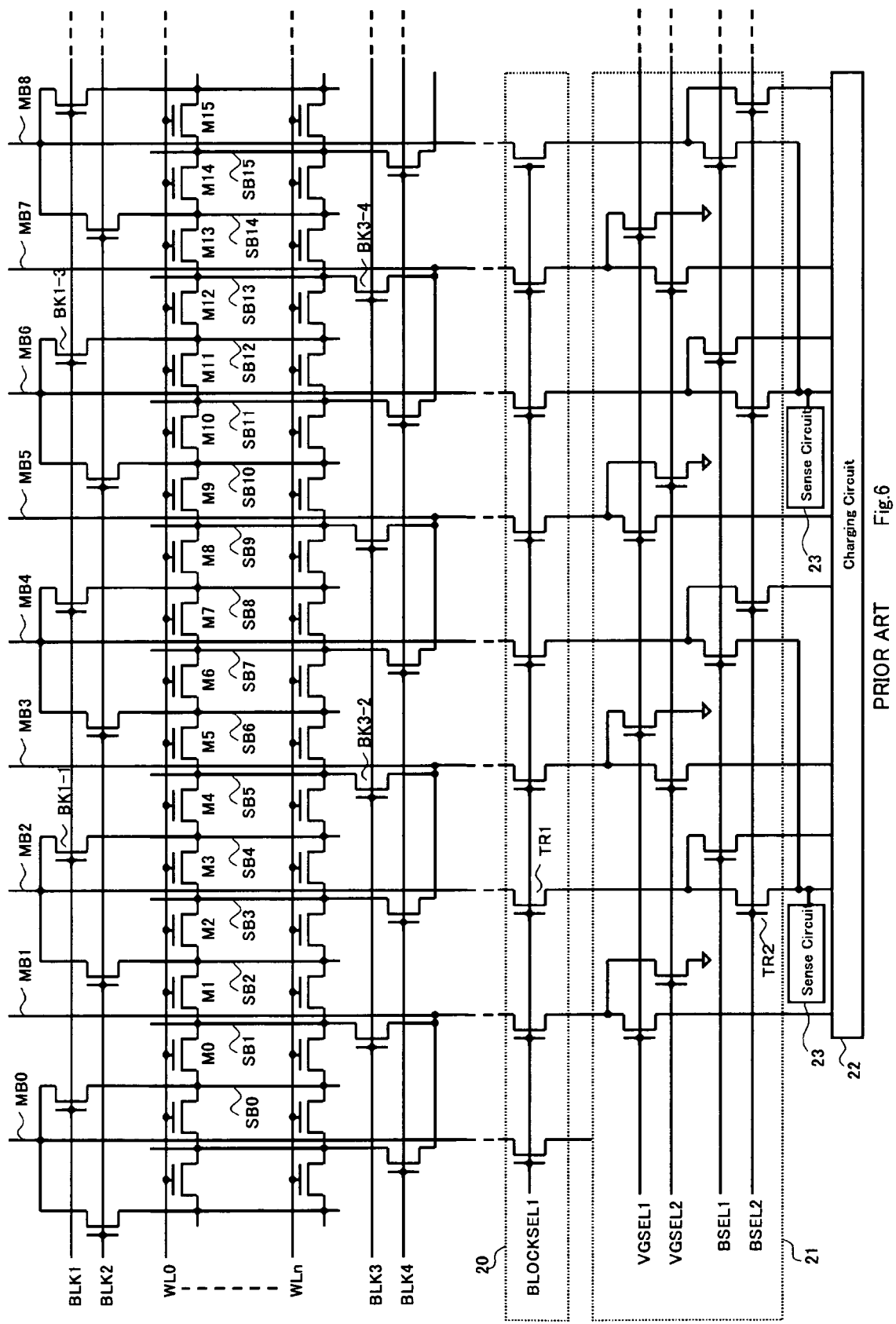
FIG. 6 is a circuit diagram showing an essential part of a constitution example of a memory cell array in a hierarchical bit line mode in a conventional semiconductor memory device.
Figure 7:
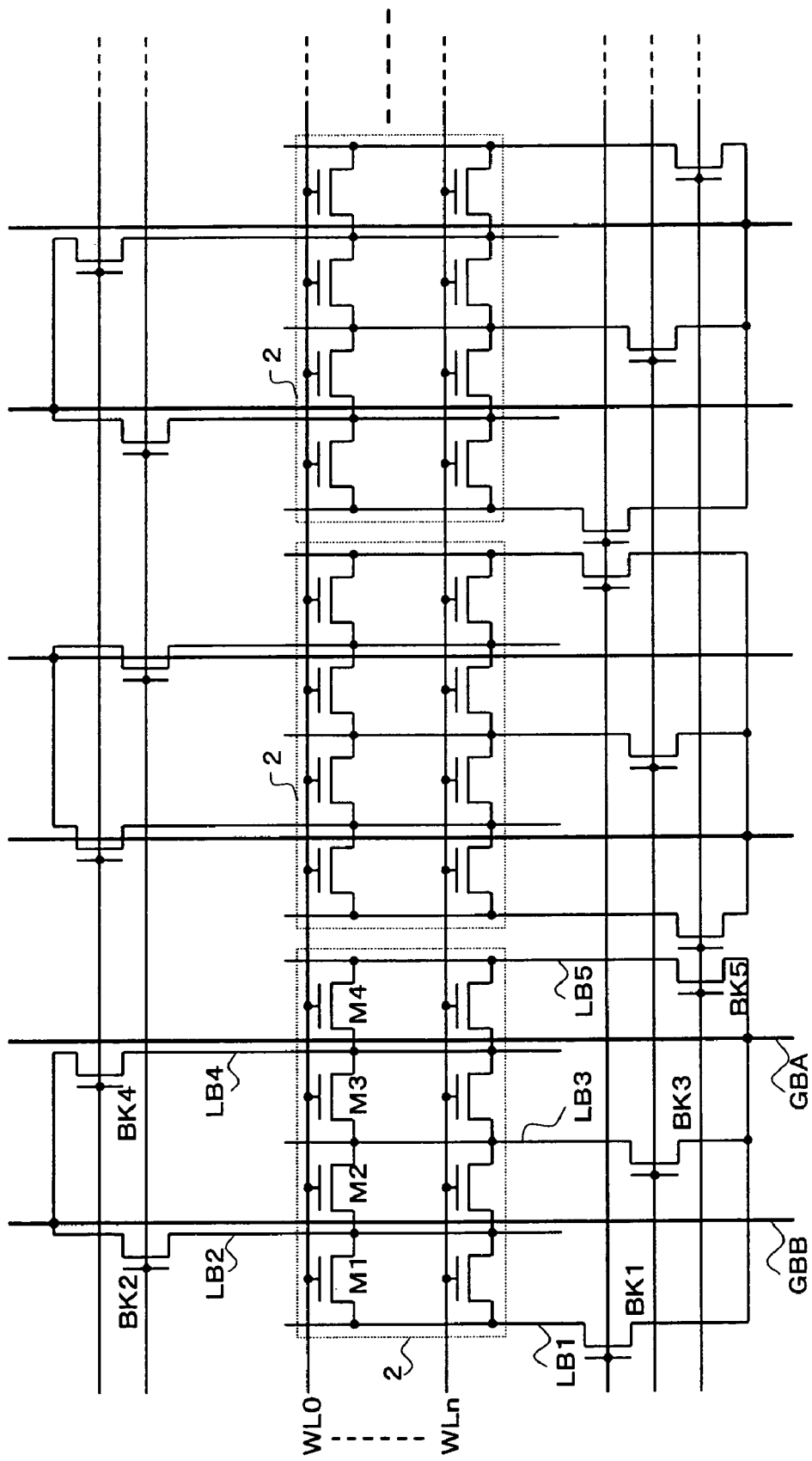
FIG. 7 is a circuit diagram showing an essential part of an example in which a memory cell array in a virtual ground line mode employing a memory cell array structure in a hierarchical bit line mode is divided into a plurality of sub-arrays in a row direction.
Figure 8:
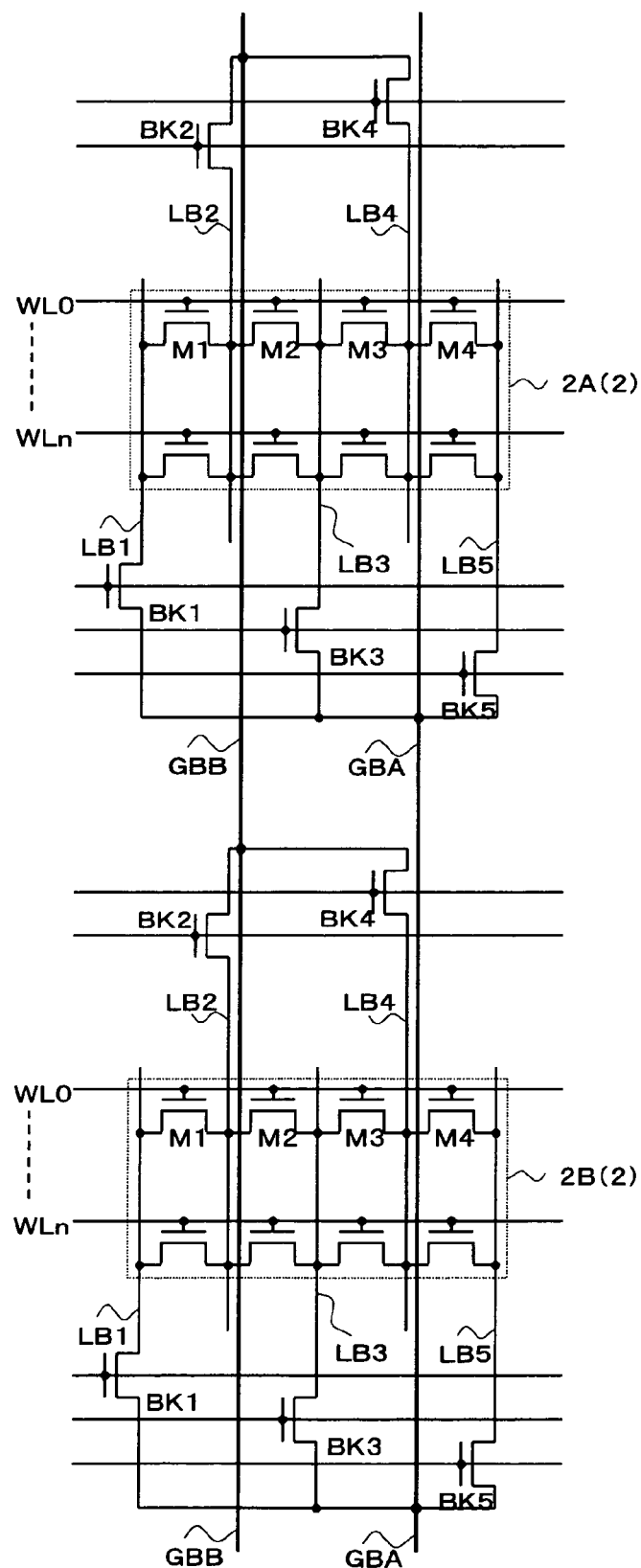
FIG. 8 is a circuit diagram showing an essential part of a constitution of a memory cell array when the sub-arrays shown in FIG. 7 are arranged in a column direction in a conventional hierarchical bit line mode.
Figure 9:
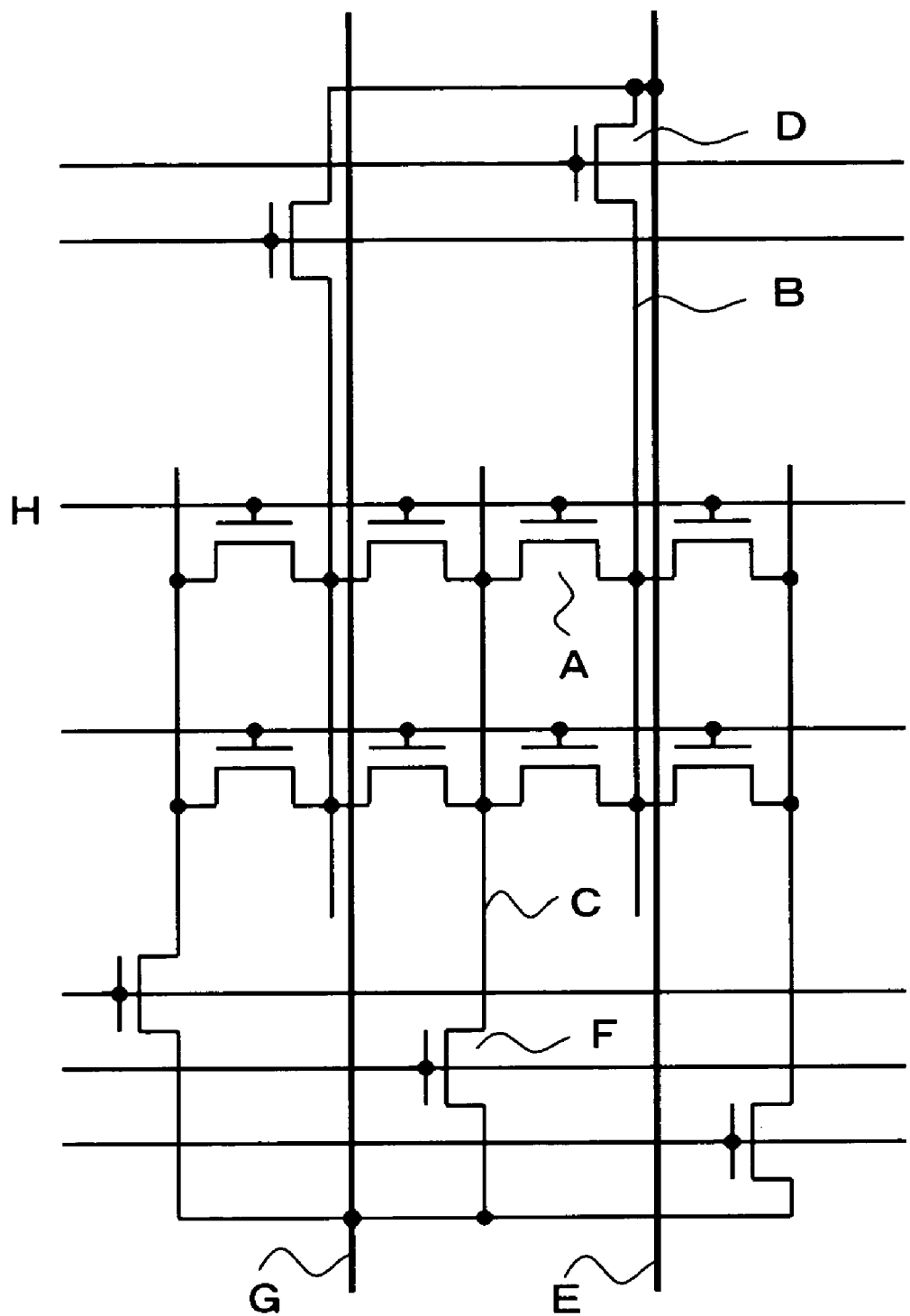
FIG. 9 is a circuit diagram showing an essential part of one sub-array in the memory cell array constitution shown in FIG. 8.

The memory cell 1 is a non-volatile memory cell comprising a gate electrode (a first electrode), a source electrode (one of second electrodes) and a drain electrode (the other of the second electrodes), and having a MOSFET structure in which memory contents can be read according to a conductive state between the source and the drain electrodes, depending on a potential of the gate electrode. According to this embodiment, it comprises a sidewall memory element 200 shown in FIG. 4(A) which comprises a gate electrode 104 formed on a semiconductor layer 102 through a gate insulation film 103, a channel region 101 arranged under the gate electrode 104, a diffusion region (source electrode) 105 and a diffusion region (drain electrode) 106 arranged on both sides of the channel region 101 and having a conductivity type opposite to that of the channel region 101, and a memory functioning body 107 formed on the source side of the sidewall of the gate electrode 104 and having a function to maintain electric charges. The sidewall memory element 200 in the embodiment 2 is different from the sidewall memory element 100 in the embodiment 1 in that the memory functioning body 107 is formed only on the source side of the sidewall of the gate electrode 104. Although the case where the memory functioning body is formed only on the source side of the sidewall is illustrated in the embodiment 2, the memory functioning body may be formed only on the drain side of the sidewall.

In each of the sub-array 2, the gate electrodes of the memory cells 1 in the same row are connected to a common word line, one source electrode is connected to the other drain electrode between the two adjacent memory cells in the row direction, and the source electrodes or the drain electrodes of the memory cells in the same column are connected to a common sub-bit line LBi (i=1 to 5). The sub-bit lines LBi comprise odd-numbered first bit lines LBi (i=1, 3 and 5) and even-numbered second bit lines LBi (i=2 and 4). In addition, each sub-array 2 in the same column comprises a common main bit line GBA and a common second main bit line GBB.

Referring to FIG. 2, in the plurality of the sub-arrays 2 positioned in the same column and connected to the common first main bit line GBA and the common second main bit line GBB, the odd-numbered sub-array is a sub-array 2A and the even-numbered sub-array is a sub-array 2B. Thus, according to this embodiment, in the sub-array 2A, the three first bit lines LBi (i=1, 3 and 5) are connected to the first main bit line GBA through selection transistors BK1, BK3 and BK5, respectively, and the two second bit lines LBi (i=2 and 4) are connected to the second main bit line GBB through selection transistors BK2 and BK4, respectively, and in the other sub-array 2B, the three first bit lines LBi (i=1, 3 and 5) are connected to the second main bit line GBB through selection transistors BK1, BK3 and BK5, respectively, and the two second bit lines LBi (i=2 and 4) are connected to the first main bit line GBA through selection transistors BK2 and BK4, respectively, As shown in FIG. 2, the first main bit line GBA is connected to the three selection transistors BK1, BK3 and BK5, in the odd-numbered sub-array 2A, and it is connected to the two selection transistors BK2 and BK4 in the even-numbered sub-array 2B. In addition, the second main bit line GBB is connected to the two selection transistors BK2 and BK4 in the odd-numbered sub-array 2A, and it is connected to the three selection transistors BK1, BK3 and BK5 in the even-numbered sub-array 2B. Therefore, each of the first main bit line GBA and the second main bit line GBB is connected to all of the five selection transistors BKi (i=1 to 5) in a couple of the odd-numbered sub-array 2A and the even-numbered sub-array 2B and junction capacity in each main bit line is equal. Therefore, totals of the junction capacities of the selection transistors BKi (i=1 to 5) contained in wiring capacities of the first main bit line GBA and the second main bit line GBB commonly connected to the sub-arrays positioned in the same column are equal to each other, and each wiring capacity becomes equal. As a result, a time delay caused by a difference in wiring capacity between the two main bit lines is not generated between a charging and discharging time of the first main bit line GBA at the time of a readout operation by connecting the first main bit line GBA to a sense amplifier as a data readout main bit line and connecting the second main bit line GBB to the ground potential, and a charging and discharging time of the second main bit line GBB at the time of readout operation by connecting the second main bit line GBB to the sense amplifier as the data readout main bit line and connecting the first main bit line GBA to the ground potential. Thus, a readout access time can be prevented from being fluctuated.

A description will be made of a voltage condition applied to each part when information stored in the memory functioning body of the memory cell 1A in the sub-array 2A is read out. First, in order to select the memory cell 1A, the selection transistors BK1 and BK2 in the sub-array 2A are turned on and the other selection transistors BK3 to BK5 in the sub-array 2A and all of the selection transistors in the other sub-array are turned off. Then, 3V is applied to a word line WLa connected to the gate electrode of the memory cell 1A, for example, and the first main bit line GBA is connected to the ground potential, and the second main bit line GBB is connected to a sense amplifier (not shown) and charged to 1.2V. Since 0V is applied to the first main bit line GBA and 1.2V is applied to the second main bit line GBB, 1.2V is applied to the drain electrode which is on the opposite side of the memory functioning body of the memory cell 1A through the second bit line LB2, and 0V is applied to the source electrode on the side of the memory functioning body through the first bit line LB1. Thus, information stored in the memory functioning body, that is, a current corresponding to an amount of electrons stored in the memory functioning body flows from the second main bit line GBB to the first main bit line GBA as a cell current of the memory cell 1A. By comparing the current with a reference current of a reference cell (not shown) by the sense amplifier (not shown), the data of the memory cell 1A is read out.

In addition, when the memory cell 1B next to the memory cell 1A in the row direction is read out, in order to select the memory cell 1B, the selection transistors BK2 and BK3 of the sub-array 2A are turned on, the other selection transistors BK1, BK4, and BK5 of the sub-array 2A and all of the selection transistor of the other sub-array are turned off, 3V is applied to the word line WLa connected to the gate electrode of the memory cell 1A, for example, the second main bit line GBB is connected to the ground potential, and the first main bit line GBA is connected to the sense amplifier (not shown) and charged to 1.2V. Since 1.2V is applied to the first main bit line GBA, and 0V is applied to the second main bit line GBB, 1.2V is applied to the drain electrode opposite to the memory functioning body of the memory cell 1B through the first bit line LB 3, and 0V is applied to the source electrode on the memory functioning body side through the second bit line LB2. Thus, information written in the memory functioning body, that is, a current corresponding to an amount of electrons stored in the memory functioning body flows from the first main bit line GBA to the second main bit line GBB as a cell current of the memory cell 1B. By comparing the current with a reference current of a reference cell (not shown) by the sense amplifier (not shown), the data of the memory cell 1B is read out.

Here, since the wiring capacity of the first main bit line GBA is equal to that of the second main bit line GBB, when the data in the memory cell 1A and the memory cell 1B are read out, if an electron amount stored in the memory functioning body of each memory cell is the same, their access times for data readout become the same.

In addition, when the memory functioning body of the memory cell 1A is formed on the drain side of the sidewall of the gate electrode, the conditions of the two main bit lines GBA and GBB are reversed, the second main bit line GBB is connected to the ground potential, and the first main bit line GBA is connected to the sense amplifier and charged to 1.2V. Regarding the memory cell 1B, conditions of the two main bit lines GBA and GBB are similarly reversed.

What is claimed is:

1. A semiconductor memory device comprising a memory cell array in which sub-arrays are arranged at least in a column direction, wherein
    the sub-array comprises memory cells each having a first electrode and a pair of second electrodes and being able to read out memory contents by a conductive state between the second electrodes depending on a potential of the first electrode, which are arranged with even numbers in a row direction and with plural numbers in the column direction in the shape of an array,
    the sub-array is provided such that the first electrodes of the memory cells in the same row are connected to a common word line, the second electrodes on one side are connected between the adjacent two memory cells in the row direction, the second electrodes on one side of the memory cells in the same column are connected to a common first bit line, the second electrodes on the other side of the memory cells in the same column are connected to a common second bit line, and the first bit lines and the second bit lines are alternately provided,
    each of the sub-arrays in the same column comprises a common first main bit line and a common second main bit line,
    the first bit lines of one half of the sub-arrays positioned in the same column are connected to the first main bit line through selection transistors and the second bit lines thereof are connected to the second main bit line through selection transistors,
    the first bit lines of the other half of the sub-arrays positioned in the same column are connected to the second main bit line through selection transistors and the second bit lines thereof are connected to the first main bit line through selection transistors.

2. The semiconductor memory device according to claim 1, wherein the memory cell array comprises sub-arrays arranged in the row direction and the column direction in the shape of an array.

3. The semiconductor memory device according to claim 1, wherein the memory cell has a symmetric cell structure in the pair of second electrodes and can distinguish data to be read out by plus or minus of a current direction in a conductive state of the pair of second electrodes.

4. The semiconductor memory device according to claim 3, wherein the memory cell comprises a gate electrode formed on a semiconductor layer through a gate insulation film, a channel region arranged under the gate electrode, a diffusion region arranged on each side of the channel region and having a conductivity type opposite to that of the channel region, and a memory functioning body formed on each side of the gate electrode and having a function to hold electric charges.

5. The semiconductor memory device according to claim 1, wherein
    the memory cell has an asymmetric cell structure in the pair of the second electrodes and can read out data only by levels of a current in one direction in a conductive state between the pair of second electrodes, and
    asymmetry of each of the memory cells in the same row in the sub-array is oriented in the same direction.

6. The semiconductor memory device according to claim 5, wherein the memory cell comprises a gate electrode formed on a semiconductor layer through a gate insulation film, a channel region arranged under the gate electrode, a diffusion region arranged on each side of the channel region and having a conductivity type opposite to that of the channel region, and a memory functioning body formed on one side of the gate electrode and having a function to hold electric charges.

7. The semiconductor memory device according to claim 1, wherein the memory cell is a non-volatile memory cell having an MOSFET structure, in which the first electrode is a gate electrode in the MOSFET structure and the pair of second electrodes is a drain electrode and a source electrode in the MOSFET structure.

8. The semiconductor memory device according to claim 1, wherein the number of the memory cells arranged in the same row of the sub-array is four, eight, or sixteen.

* * * * *